(12) United States Patent
Wei et al.

(10) Patent No.: US 7,205,740 B1
(45) Date of Patent: Apr. 17, 2007

(54) FAN CONTROL DEVICE FOR FREQUENCY CONVERTER

(75) Inventors: Ta-Chang Wei, Taoyuan Hsien (TW); Ming-Hsiang Tzeng, Taoyuan Hsien (TW); Chih-Hsiung Tsai, Taoyuan Hsien (TW)

(73) Assignee: Delta Elctronics, Inc., Tayouan (TW)

( * ) Notice: Subject to any disclaimer, the term of this patent is extended or adjusted under 35 U.S.C. 154(b) by 0 days.

(21) Appl. No.: 11/377,445

(22) Filed: Mar. 17, 2006

(51) Int. Cl.
  *F04B 41/06* (2006.01)
  *H02M 7/02* (2006.01)

(52) U.S. Cl. .................. 318/473; 388/934; 318/434

(58) Field of Classification Search ........ 318/430–434, 318/471–473; 388/909, 934; 310/52, 58, 310/62–63
See application file for complete search history.

(56) References Cited

U.S. PATENT DOCUMENTS

| | | | |
|---|---|---|---|
| 5,790,430 A | * | 8/1998 | Steiert ........................ 340/648 |
| 5,825,642 A | * | 10/1998 | Ishii et al. ................... 363/141 |
| 5,930,112 A | * | 7/1999 | Babinski et al. ............. 361/695 |
| 6,876,164 B2 | * | 4/2005 | Liu ............................. 318/434 |
| 6,950,969 B2 | * | 9/2005 | Thompson et al. ........... 714/44 |

\* cited by examiner

*Primary Examiner*—Bentsu Ro (57) ABSTRACT

A fan controlling device for a frequency converter, which is applied to a high-power frequency transforming system that installs fans according to the heat dissipating requirements and their switching operation, failure detection and control, and the fan controlling device includes a frequency transformer and a plurality of direct current fans connected to the frequency transforming system, and each fan is installed at a desired position for dissipating heat in a casing of the frequency transformer by locking, sliding tracks, drawing or latching and each fan is connected to a fan controlling device, and a sensor of the fan controlling device detects the temperature of each set temperature point for switching the fans, controlling the operating number and speed of the fans, so as to improve the quantity, position, operability of installed fans as well as reducing the power consumption when the fans are at an idle state.

6 Claims, 8 Drawing Sheets

|  | Start Operating Temperature (OR) ≥ | | | | | Stop Operating Temperature (AND) ≤ | | | | |
| --- | --- | --- | --- | --- | --- | --- | --- | --- | --- | --- |
|  | OH1 | OH2 | OH3 | OH4 | OH5 | OH1 | OH2 | OH3 | OH4 | OH5 |
| First Fan Module | 63°C | 63°C | 66°C | --- | --- | 48°C | 48°C | 51°C | --- | --- |
| Second Fan Module | 73°C | 73°C | 76°C | --- | --- | 58°C | 58°C | 61°C | --- | --- |
| Third Fan Module | --- | --- | --- | 45°C | 85°C | --- | --- | --- | 25°C | 60°C |

FAN CONTROL DEVICE FOR FREQUENCY CONVERTER

BACKGROUND OF THE INVENTION

1. Field of the Invention

The present invention relates to a frequency converter, and more particularly to a fan control device for a frequency converter that installs heat dissipating fans according to the internal mechanical design and the heat dissipating requirements of the frequency converter and uses the internal temperature change to control the speed of the fans of the frequency converter.

2. Description of Prior Art

In general, present heat dissipating designs used in a frequency converter system adopt heat dissipating fans to achieve a heat dissipating function, and the positions for installing the heat dissipating fans and the operation control of the fans determine the heat dissipating effect. Thus, good layout design and operation control will enhance the operating performance of the frequency converter.

The prior art heat dissipating devices applied to a high-power frequency converter system (over 200 HP) install AC fans. Although it is easier to use AC fans, yet the AC fans can be installed and fixed in a specific direction only and thus constituting a limitation to the mechanical design of the frequency converter system. In other words, the direction and position for installing the AC fans cannot be changed flexibly according to the mechanical design and the heat dissipating requirements. Further, the operation of AC fans requires a fixed voltage supply, but a constant operating speed is usually required. The AC fans cannot be operated at different speeds according to the actual temperature change, and thus these AC fans have a poor speed control capability. If it is necessary to control the speed of an AC fan, a complicated drive circuit will be needed. As a result, the production cost will be increased. In addition, the AC fan is driven by a fixed voltage to maintain a constant speed for its operation even when the frequency converter is at an idle state, and thus wasting unnecessary power consumption at an idle state as well as creating a noise problem.

SUMMARY OF THE INVENTION

In view of the foregoing shortcomings of the prior art, the inventor of the present invention based on years of experience in the related industry to conduct experiments and modifications, and finally designed a fan control device for a frequency converter to overcome the shortcomings of the prior art structure.

The present invention is to overcome the shortcomings of the prior art and avoid the existing deficiencies by installing DC fan modules according to the mechanical design and the required quantity and installing position for dissipating heat and detecting the internal temperature to control or switch each DC fan and monitoring any failure of a DC fan and replacing the failed DC fan in a simple and easy manner. The invention installs and controls the AC fans of a frequency converter system to enhance the installation of the fans and overcome the limitation to the mechanical design. The fan control device for a frequency converter of the invention has the capability of controlling the speed of the fans, saving power at an idle state and providing users a simple, easy, low-priced, small-sized and easy-to-install fan control device for a frequency converter.

To achieve the foregoing objective, the fan control device for a frequency converter in accordance with the present invention comprises:

a rectification circuit, electrically coupled to an external AC power supply, for converting an AC into a DC output;

a DC/DC conversion circuit, electrically coupled to the rectification circuit, for converting a DC operating voltage output;

a fan module, electrically coupled to the DC/DC conversion circuit and disposed at each mechanical structure of the frequency converter and an installing area that requires heat dissipation;

a fan control circuit, electrically coupled to the DC/DC conversion circuit, for receiving and controlling an operation or a halt of the fan module; and a sensor, electrically coupled to the fan control circuit and disposed at each mechanical structure of the frequency converter and a position that requires heat dissipation;

wherein the fan control circuit has a temperature parameter for each mechanical structure of the frequency converter and each position that requires heat dissipation and outputs a control signal to control the speed, quantity, start or stop of a fan according to a temperature change of each mechanical structure of the frequency converter and each position that requires heat dissipation detected by the sensor.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The technical characteristics, features and advantages of the present invention will become apparent in the following detailed description of the preferred embodiments with reference to the accompanying drawings.

Referring to FIGS. 1 to 6 for the perspective view, the partial exploded view, the exploded view, and different schematic views of a fan control device for a frequency converter in accordance with the present invention respectively, the fan control device for a frequency converter according to a preferred embodiment of the invention comprises: a frequency converter 1 and a first, a second and a third fan modules 2, 3, 4, and the temperature of each mechanical structure in the frequency converter 1 determines the operating speeds of the first, second and third fan modules 2, 3, 4, so as to achieve the optimal speed control effect as well as the power-saving effect when the frequency converter 1 is at an idle state. The speed control device of the invention is applicable to a high-power frequency converter system (over 200 HP).

Figure 1:
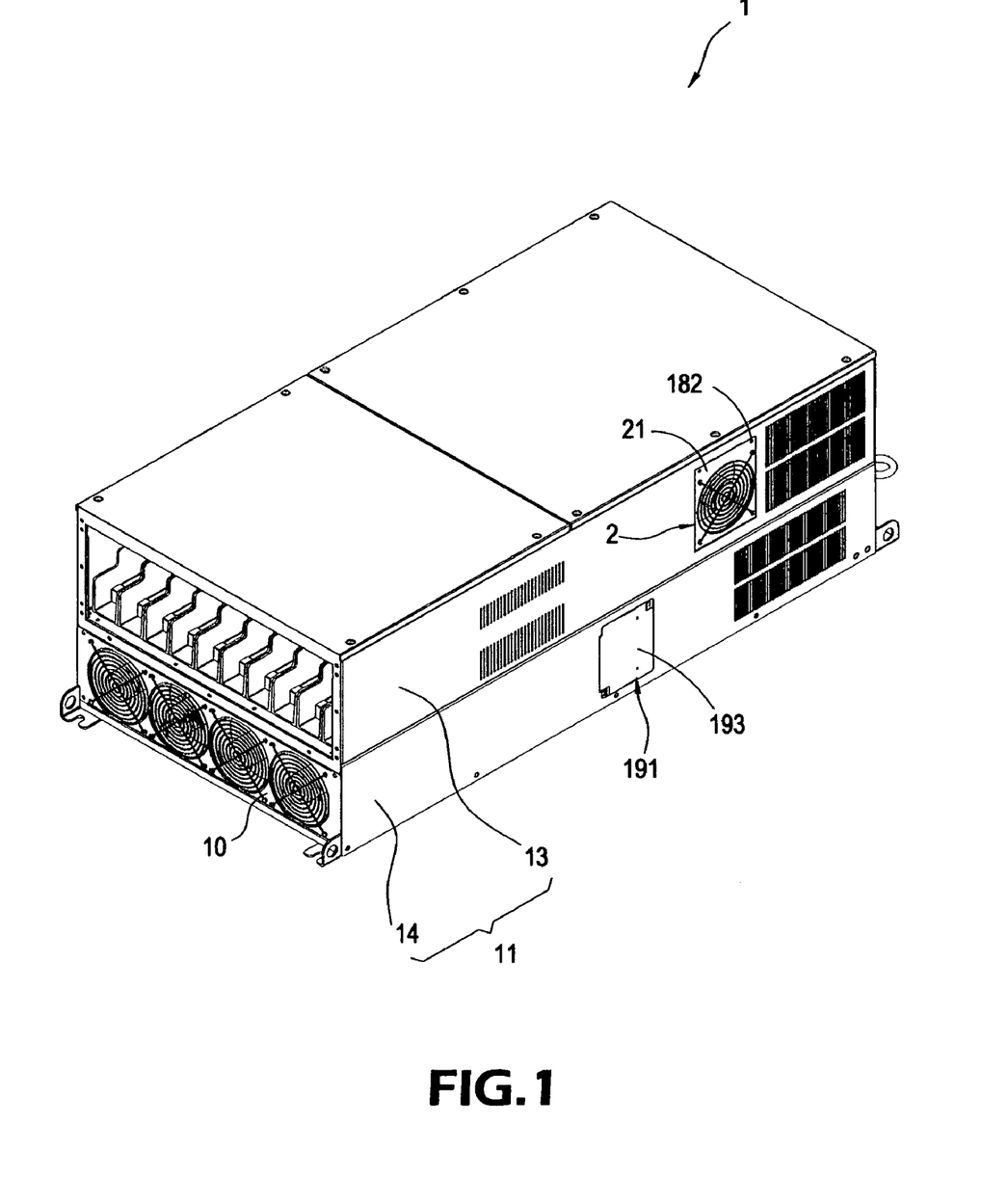
FIG. 1 is a perspective view of a fan control device according to a preferred embodiment of the invention.
Figure 2:
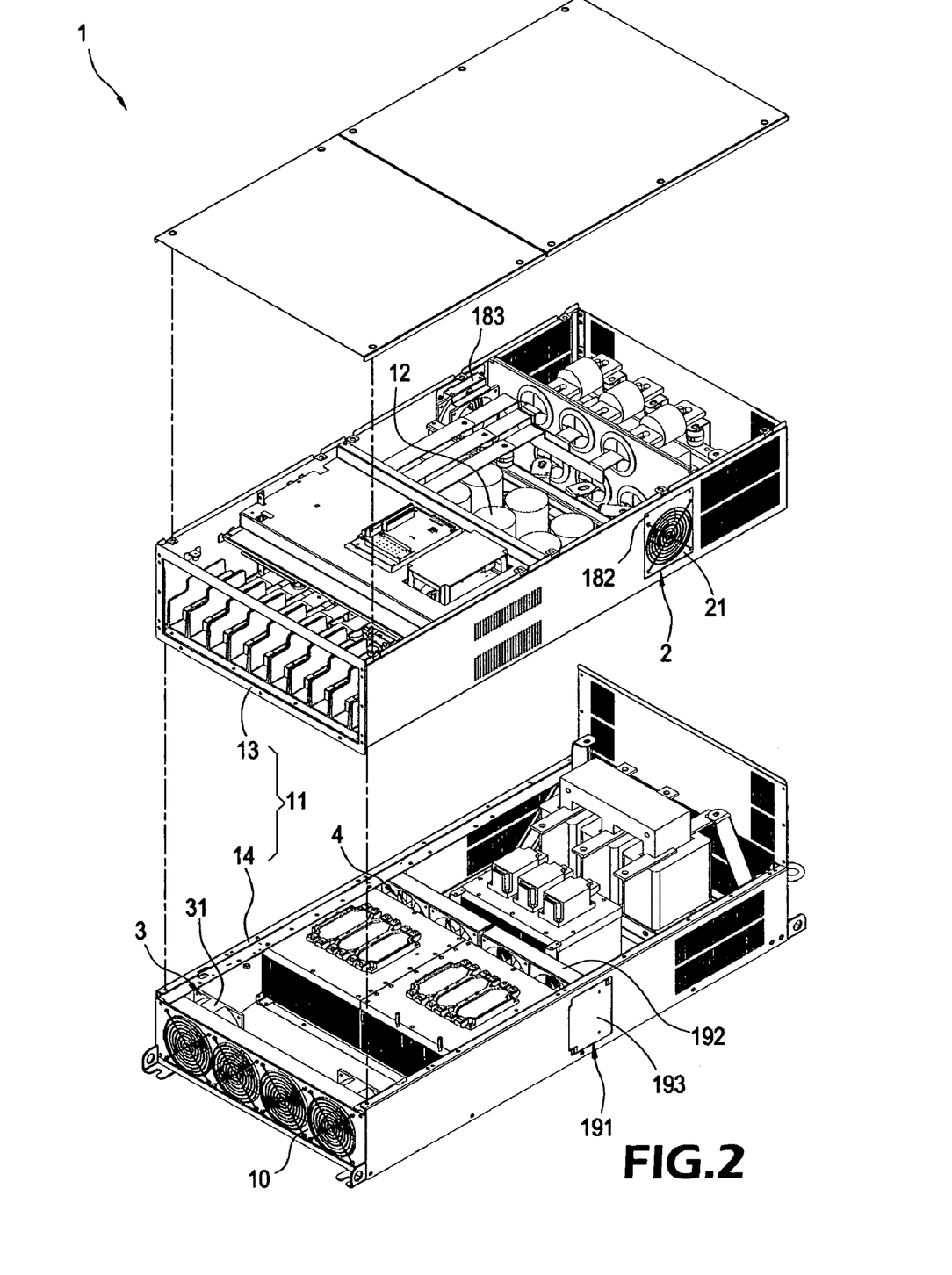
FIG. 2 is a partial exploded view of a preferred embodiment of the invention.

The frequency converter 1 comprises a casing 11 and a frequency conversion circuit 12 disposed in the casing 11. The casing 11 further includes a first casing 13 disposed at the top of the casing 11 and a second casing 14 disposed at the bottom of the casing 11, and both sides of the first casing 13 include a first installing area 15, and a front end of the second casing 14 includes a second installing area 16 and both sides of the second casing 14 include a third installing area 17 for coupling the first, second and third fan modules 2, 3, 4.

Figure 3:
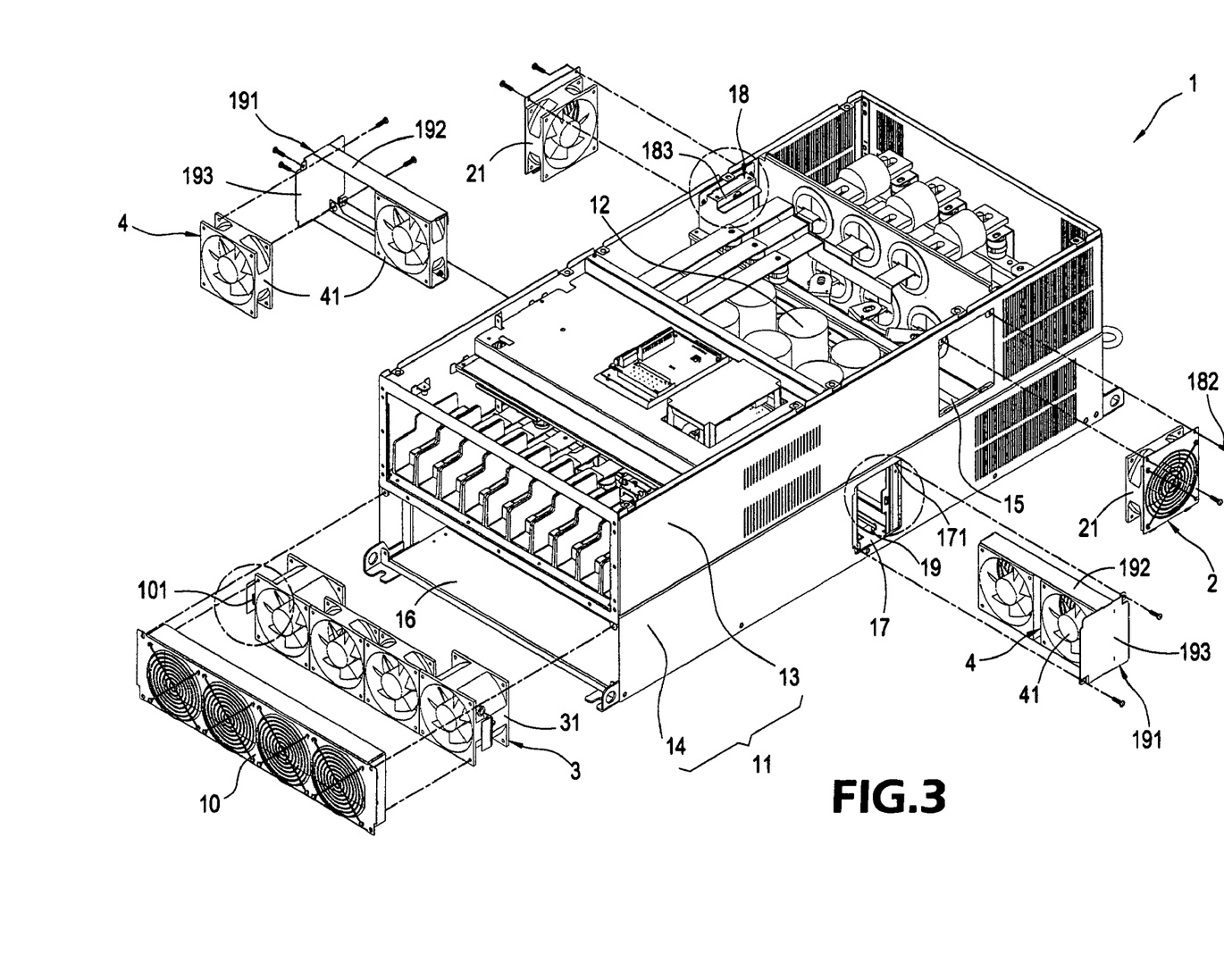
FIG. 3 is an exploded view of the installing each fan module of a fan control device according to a preferred embodiment of the invention.

The first, second and third fan modules 2, 3, 4 include a first fan module 2 coupled to the first installing area 15, a second fan module 3 coupled to the second installing area 16, and a third fan module 4 coupled to the third installing area 17. The first, second and third fan modules 2, 3, 4 separately comprise at least one DC fan 21, 31, 41 with a same specification or a different specification, and the first, second and third fan modules 2, 3, 4 are coupled into the installing areas 15, 16, 17 at predetermined positions of the first and second casings 13, 14 by a coupling method selected from a locking method, a sliding track method, a detaching method, or a latching method.

Figure 4:
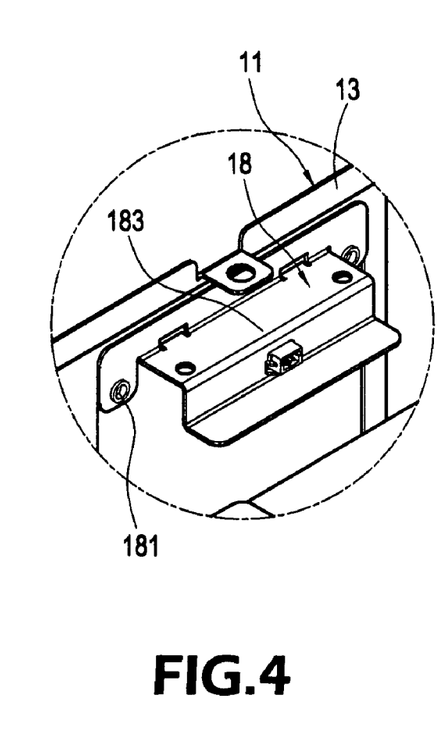
FIG. 4 is a schematic view of mounting a fan module of a fan control device according to a preferred embodiment of the invention.

Referring to FIGS. 3 and 4 for the locking method, the first installing area 15 of the first casing 13 is used for illustration. A support stand 18 is disposed on an internal side of the first installing area 15, and the support stand 18 includes a plurality of screw holes 181 to collocate with a locking element 182 such as a screw for directly mounting the fan 21 onto the support stand 18. The support stand 18 further includes a blocking portion 183 to form a blocking position at an internal end when the fan 21 is installed and prevent the casing 14 from being displaced or fallen out.

Figure 5:
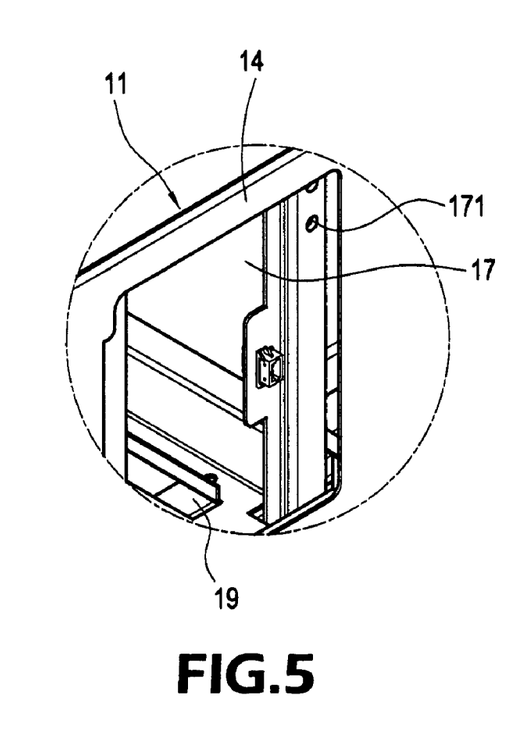
FIG. 5 is a schematic view of installing a fan module onto a sliding track of a fan control device according to a preferred embodiment of the invention.

Referring to FIGS. 3 and 5 for the sliding track method, the third installing area 17 of the second casing 14 is used for illustration. The sliding track method includes a track 19 and a frame 191 capable of sliding into the track 19, wherein the track 19 is fixed into the third installing area 17, and the frame 191 includes a frame body 192 and a frame panel 193, and the frame body 192 is hollow and collocates with a locking element to fix a DC fan 41 of the third fan module 4 into the frame body 192 and couple the frame body 182 into the track 19 by the frame 191, and the frame panel 193 seals the entry of the corresponding third installing area 17 or collocates with a locking element for positioning and fixing the locking hole 171 onto a sidewall of the corresponding third installing area 17.

Figure 6:
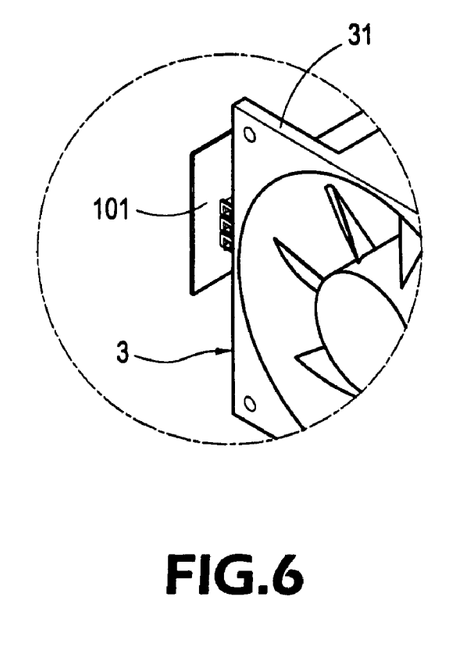
FIG. 6 is a schematic view of detaching a fan module of a frequency converter according to a preferred embodiment of the invention.

Referring to FIGS. 3 and 6 for the detaching method, the second installing area 16 of the casing 14 is used for illustration. The detaching method comprises a protective cover 10 and a bracket 101 capable of latching a DC fan 31 to the protective cover 10, wherein the bracket 101 is fixed onto both sides of a plurality of DC fans 31 of the second fan module 3 and the DC fans 31 are detachably latched into the protective cover 10, and the protective cover 10 corresponds to the second installing area 16 and is locked and positioned by the locking element.

Since the first, second and third fan modules 2, 3, 4 install DC fans to be applied in a high-power frequency converter 1 (over 200 HP), the installing direction and position of the AC fans can be improved and the problems of a limited structural design, a large volume, a large occupying space can be solved.

Further, the volume of DC fans is small, and thus the DC fans can meet the requirements of the mechanical design and heat dissipation for the design of the first, second and third fan modules 2, 3, 4. The installing position and quantity of the DC fans can simply the design.

Figure 7:
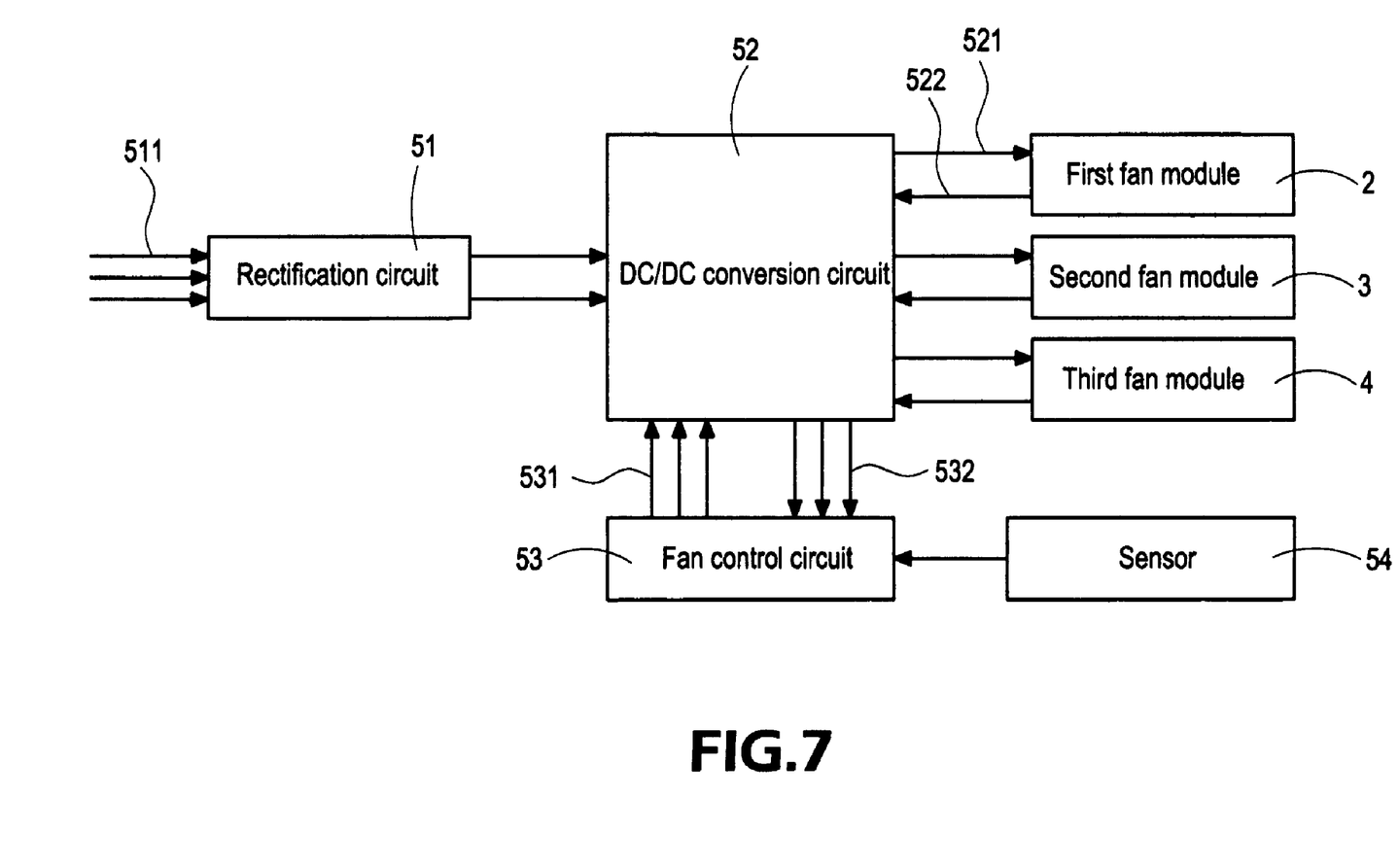
FIG. 7 is schematic circuit block diagram of a fan control device according to a preferred embodiment of the invention.

As to the control of the operations of the first, second and third fan modules 2, 3, 4 installed in the frequency converter 1, a control device 5 is used for the control. Referring to FIG. 7, the control device 5 is electrically coupled to each of the first, second and third fan modules 2, 3, 4, and the internal temperature change of the first and second casing 13, 14 determines the control of the operating mode of the first, second and third fan modules 2, 3, 4. In FIG. 7, the control device 5 comprises a rectification circuit 51 electrically coupled to a DC/DC conversion circuit 52 of the first, second and third fan modules 2, 3, 4, a fan control circuit 53 electrically coupled to the DC/DC conversion circuit, and a plurality of temperature sensors 54 electrically coupled to the fan control circuit 53 for detecting the temperature change at each set temperature point anytime as a control parameter of the control circuit. The rectification circuit 51 is electrically coupled to an external power supply (not shown in the figure) through a connecting line 511 for converting the electric power into a DC power output.

The DC/DC conversion circuit 52 is coupled to the rectification circuit 51 for obtaining a high-voltage DC power and converting the power into an operating voltage output required for the first, second and third fan modules 2, 3, 4, and the DC/DC conversion circuit 52 is coupled separately to a power line 521, a fan stall line 522, and the first, second and third fan modules 2, 3, 4, wherein each power line 521 is connected for supplying the operating power for the first, second and third fan modules 2, 3, 4, and the fan stall line 522 feeds back a failure signal of the first, second and third fan modules 2, 3, 4.

The sensor 54 is installed on each component such as a capacitor (OH1), a SCR controller (OH2), a casing (OH3), a right gate bipolar transistor (IGBT) (OH4) and a left gate bipolar transistor (IGBT) (OH5) in the frequency converter 1 for detecting the temperature change of each component and sending the detected temperature signal to the fan control circuit 53.

Figure 8:
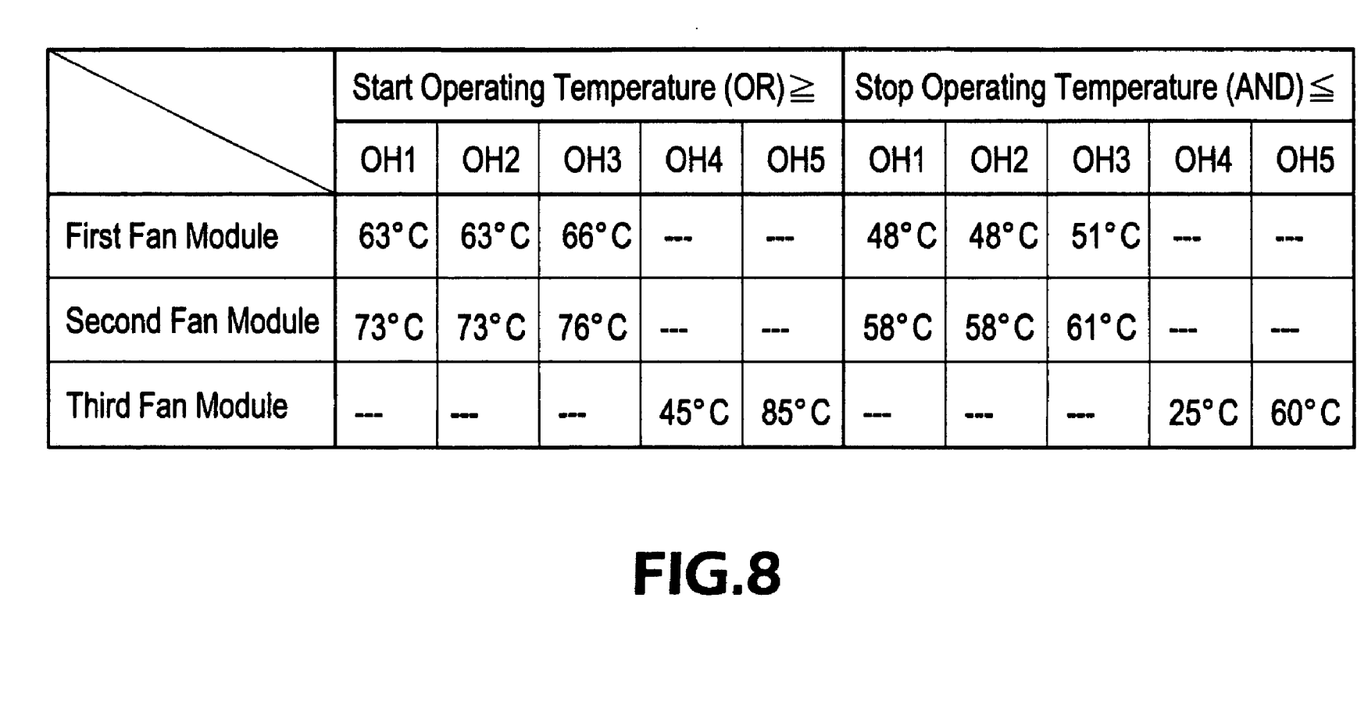
FIG. 8 shows a list of the temperature when each fan module is turned on or off according to a preferred embodiment of the invention.

The fan control circuit 53 is electrically coupled to the first, second and third fan modules 2, 3, 4 through the DC/DC conversion circuit 52 for transmitting control signals through the fan control line 531 and the fan stall line 532 of different components. The fan control circuit 53 sets a plurality of parameters for the quantity, start and stop of the first, second and third fan modules 2, 3, 4 corresponding to the temperature change of each temperature point as shown in FIG. 8.

The temperature points of the temperature change is set by a user according to the mechanical design and the heat dissipating requirements for setting the quantity and position of the detections. In this preferred embodiment, the temperature points for detection include the temperature of a capacitor (OH1), the temperature of a SCR controller (OH2), the temperature of an interior of the casing (OH3), the temperature of a right gate bipolar transistor (IGBT) (OH4) and the temperature of a left gate bipolar transistor (IGBT) (OH5). In other words, each sensor 54 detects a different temperature change of each set temperature point, and then transmits the detected signal to the fan control circuit 53, so that the fan control circuit 53 can control the start or stop of the first, second and third fan modules 2, 3, 4 at each temperature point or the fan control circuit 53 can control the different operating speeds, so as to optimize the speed control effect of the fans. When the frequency converter is in an idle state, the first, second and third fan modules 2, 3, 4 are partially operated to save power consumption.

Figure 9:
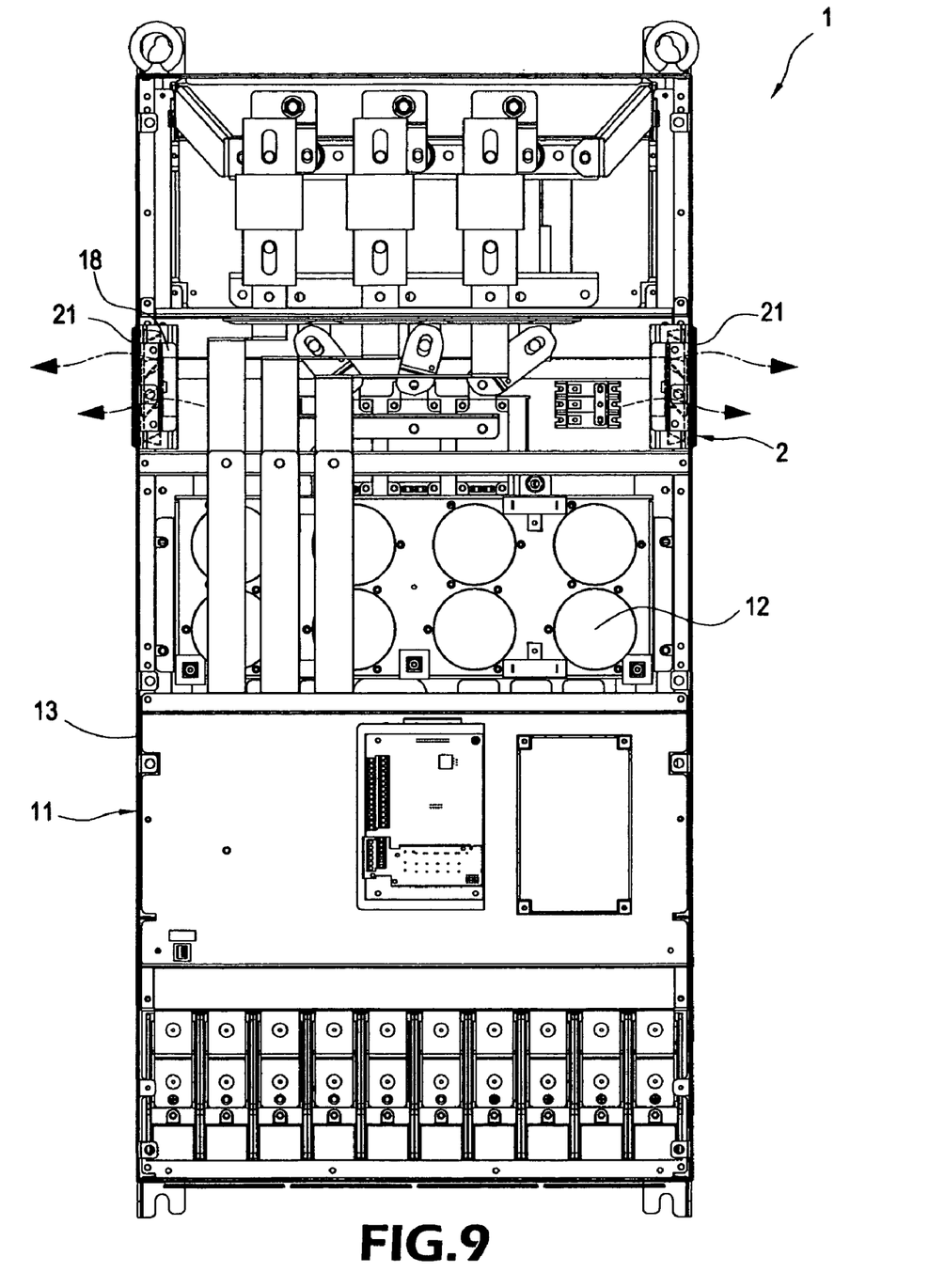
FIG. 9 is a schematic view of the heat dissipation according to a preferred embodiment of the invention.
Figure 10:
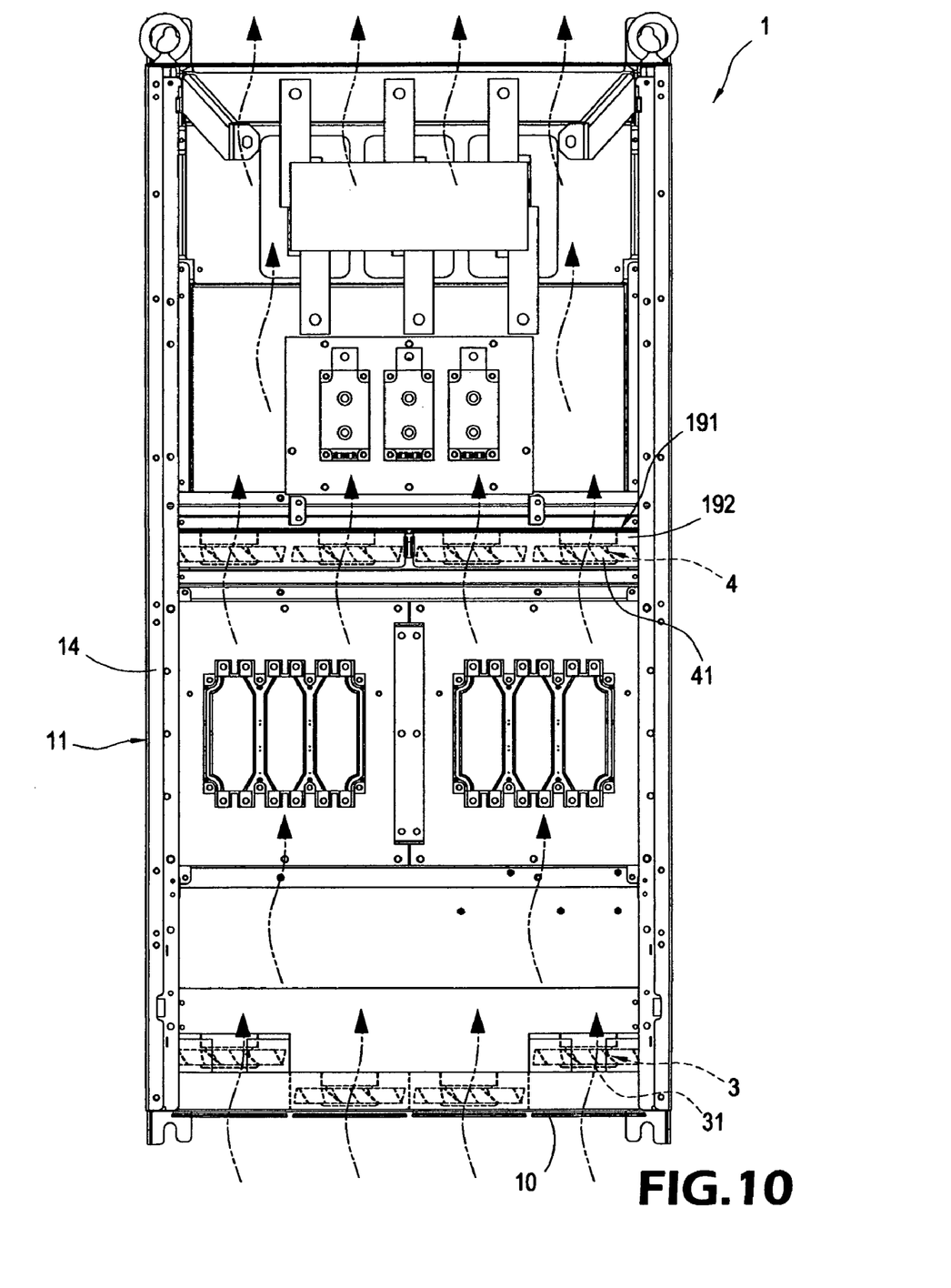
FIG. 10 is another schematic view of the heat dissipation according to a preferred embodiment of the invention.

Referring to FIGS. 9 and 10 for the schematic view of controlling the operation and heat dissipation of a frequency converter by a control circuit of the fan control device for a frequency converter in accordance with the present invention, if the sensor detects the temperature of a capacitor (OH1), the temperature of a SCR controller (OH2) and the temperature of an interior of the casing (OH3) in the first casing 13 that meet the control setup parameter for a start, then the fan control circuit 53 will output a control signal to the first fan module 2 for starting the operation of the fans, and controlling the quantity and speed of the operating fans, so as to start the operation of the first fan module 2, and the heat dissipating airflow will be introduced and discharged as shown in FIG. 9.

If the sensor 54 detects the temperature of a capacitor (OH), the temperature of a SCR controller (OH2), the temperature of an interior of the casing (OH3), the temperature of a right gate bipolar transistor (IGBT) (OH4) and the temperature of a left gate bipolar transistor (IGBT) (OH5) in the second casing 14 and the temperature change meets the control setup parameter for a start, then the fan control circuit 53 will output a control signal to the second and third fan modules 3, 4 to start the operation of fans and control the quantity and speed of the operating fans, so as to start the operations of the second and third fan modules 3, 4 and the heat dissipating airflow will be introduced and discharged as shown in FIG. 10.

If one of the fans in the first, second and third fan modules 2, 3, 4 fails, then a failure signal will be fed back to the fan control circuit 53 through the fan stall line 532 and the fan control circuit 53 will send out a fan stall signal to stop the operation of the failed fan. The rest of the fans remain operating, and we just need to replace the damaged fan only. Obviously, it is not necessary to stop the operation of all fans, and thus maintaining a continuous operation of the frequency converter 1.

The present invention are illustrated with reference to the preferred embodiment and not intended to limit the patent scope of the present invention. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A fan control device for a frequency converter, which is a control device applied to a high-power frequency converter, and the control device comprising:

a rectification circuit, electrically coupled to an external AC power supply, for converting an AC to a DC output;

a DC/DC conversion circuit, electrically coupled to the rectification circuit, for converting a DC operating voltage output;

a fan module, electrically coupled to the DC/DC conversion circuit and disposed at each mechanical structure of the frequency converter and an installing area that requires heat dissipation;

a fan control circuit, electrically coupled to the DC/DC conversion circuit, for receiving and controlling an operation or a halt of the fan module; and a sensor, electrically coupled to the fan control circuit and disposed at each mechanical structure of the frequency converter and a position that requires heat dissipation;

wherein the fan control circuit has a temperature parameter for each mechanical structure of the frequency converter and each position that requires heat dissipation and outputs a control signal to control the speed, quantity, start or stop of a fan according to a temperature change of each mechanical structure of the frequency converter and each position that requires heat dissipation detected by the sensor wherein the fan module is installed in an installing area disposed at a predetermined position of the casing by a detaching method, and wherein the detaching method comprises a protective cover and a bracket capable of latching the fan module to the protective cover, and the bracket is fixed to both sides of the fan module for detachably latching the fan module into the protective cover, and the protective cover collocates with the locking element for securing and fixing the protective cover to the corresponding installing area by the locking element.

2. The fan control device for a frequency converter of claim 1, wherein the fan module comprises at least one DC fan with a same specification.

3. The fan control device for a frequency converter of claim 1, wherein the fan module comprises at least one DC fan with a different specification.

4. The fan control device for a frequency converter of claim 1, wherein the DC/DC conversion circuit electrically coupled to the fan module comprises a power line and a fan stall line, and the power line is provided for supplying an operating power, and the fan stall line is provided for transmitting a failure signal.

5. The fan control device for a frequency converter of claim 1, wherein the fan control circuit electrically coupled to the fan module through the DC/DC conversion circuit comprises a fan control line for outputting a fan module control signal and a fan stall line for transmitting a failure signal of the fan module.

6. The fan control device for a frequency converter of claim 1, wherein the temperature points with a detected temperature change whose quantity and installing position are set according to the mechanical design or heat dissipating requirements by a user include the temperature of a capacitor, the temperature of a SCR controller, the temperature of an interior of the casing, the temperature of a right insulated gate bipolar transistor (IGBT) and the temperature of a left insulated gate bipolar transistor (IGBT).

* * * * *

UNITED STATES PATENT AND TRADEMARK OFFICE
CERTIFICATE OF CORRECTION

PATENT NO. : 7,205,740 B1 Page 1 of 1
APPLICATION NO. : 11/377445
DATED : April 17, 2007
INVENTOR(S) : Ta-Chang Wei et al.

It is certified that error appears in the above-identified patent and that said Letters Patent is hereby corrected as shown below:

On the title page, item [73]:

Assignee: Delta Elctronics, Inc. (Tayouan, TW)

should be

Assignee: Delta Electronics, Inc. (Taoyuan, TW)

"Elctronics" was wrong and --Electronics-- is correct.
"Tayouan" was wrong and --Taoyuan-- is correct.

Signed and Sealed this

Sixteenth Day of December, 2008

JON W. DUDAS
*Director of the United States Patent and Trademark Office*